April 16, 1968 K. W. BEUMER 3,377,688

CAPPING APPARATUS

Filed Feb. 24, 1966 2 Sheets-Sheet 1

INVENTOR
KARL W. BEUMER

BY Wolmar J. Stoffel
ATTORNEY

United States Patent Office 3,377,688
Patented Apr. 16, 1968

3,377,688

CAPPING APPARATUS

Karl W. Beumer, Poughkeepsie, N.Y., assignor to International Business Machines Corporation, Armonk, N.Y., a corporation of New York Filed Feb. 24, 1966, Ser. No. 529,749
8 Claims. (Cl. 29—203)

This invention relates to assembly apparatus, more particularly to apparatus for positioning cover elements on substrates, still more particularly to apparatus for automatically and precisely placing covers over module substrates in which there is a very small dimensional clearance provided between the substrate and cover.

In modern microminiaturized electronic devices, semiconductor elements and circuit elements are vulnerable to moisture and oxidation resulting generally from exposure to the atmosphere. This vulnerability makes necessary increasingly more effective sealing protection for the circuitry and circuit devices as the size of the devices becomes smaller.

Encapsulation of electronic circuit devices is well known. However, in microminiaturized circuit devices, particularly hybrid circuit devices, conventional plastics and resins used for encapsulation have not proven satisfactory. The hard plastic or resin may during cure and exposure to temperature extremes impose stresses on the small semiconductor devices and other components mounted on substrates of the circuit device. Those imposed stresses can and frequently do cause a general prying or loosening effect resulting in open circuits or erratic electrical contacts. This consideration has necessitated the use of encapsulation materials that remain relatively soft and pliable, instead of the more conventional firm plastic materials. Typically, encapsulation materials that do not cure to a hard firm mass are silicon base resins. Such soft encapsulation materials ordinarily require a rigid enclosure cover element, which is desirably sealed to exclude moisture, air, and the like.

A module structure that has been utilized in the electronic industry consists of a substrate provided with terminal pins extending from one side, circuitry and semiconductor elements mounted on the opposite side having a soft encapsulating material overlying same. A cover is mounted over the soft encapsulating material which is mechanically secured as by crimping. A sealing layer of relatively hard resin is used to subsequently seal the edge of the cover and substrate on the pin side of the substrate. In the manufacture of such modules the placing of the covers on the substrates is an exacting procedure since the dimensional clearance between the cover and substrate must be small to make possible an effective seal with the hard resin. In positioning the covers, the cover must not be allowed to come into direct engagement with the soft encapsulating material since it will adhere to the edge of the cover and subsequently prevent the formation of an effective seal when the hard resin is applied. Further, the soft and usually tacky encapsulaing material will interfere with the function of any apparatus used to mechanically position covers over the modules if it is not strictly confined to the top of the substrate.

Capping apparatus for applying covers to bottles and the like are old in the art. However, such apparatus is not capable of precisely positioning covers over substrates, particularly when the clearances between the cover elements and elements being capped are small, or preventing displacement of soft encapsulating material. Further, such apparatus are not capable of handling relatively small substrates.

An object of this invention is to provide new assembly apparatus.

Another object of this invention is to provide new apparatus capable of assembling of elements having very small clearance tolerances therebetween.

Yet another object of this invention is to provide new apparatus capable of assembling elements at very high rates.

Another object of this invention is to provide a new apparatus for accurately positioning a cover on a substrate.

Yet another object of this invention is to provide new apparatus for accurately positioning a generally rectangular-shaped cover on a generally rectangular-shaped small substrate.

Another object of this invention is to provide new apparatus for snapping covers into position over the substrate without displacing encapsulating material or the like from the top side of the substrate.

An object of this invention is to provide a capping apparatus with a malfunction means adapted to detect improperly seated covers or uncapped substrates.

Yet another object of this invention is to provide a new cover assembly apparatus adapted to specificially handle relatively small substrate elements to be capped.

The apparatus for positioning covers on substrates has a generally horizontal conveyor means with an inclined cover chute for receiving successive covers from a supply thereof. The inclined cover chute terminates over the conveyor means. A pressure means is mounted on the end of the cover chuite and is adapted in use to exert a downward force on the covers emanating from the chute. Guide means are provided adjacent the conveyor means which are positioned to initially abut and subsequently support the leading edge portions of covers emanating from the chute.

The apparatus of the invention provides a solution to problems associated with assembling elements having very small clearance dimensions, and in particular to problems associated with the manufacture of dependable, hermetically sealed electronic devices. The apparatus of the invention will dependably convey relatively small substrates to be capped to the capping zone where covers are consistently and uniformly disposed over the substrates at high volume rates and snapped into position. The controlled cover snapping action prevents material from being displaced from the top of the substrate, thus preventing contamination of the cover making possible the formation of an effective seal. Also the cover snapping action makes possible the very close tolerances between the substrate and cover.

The foregoing and other objects, features and advantages of the invention will be apparent from the following more particular description of a preferred embodiment of the invention, as illustrated in the accompanying drawings.

Figures 1, 2, 3, 4, 5:
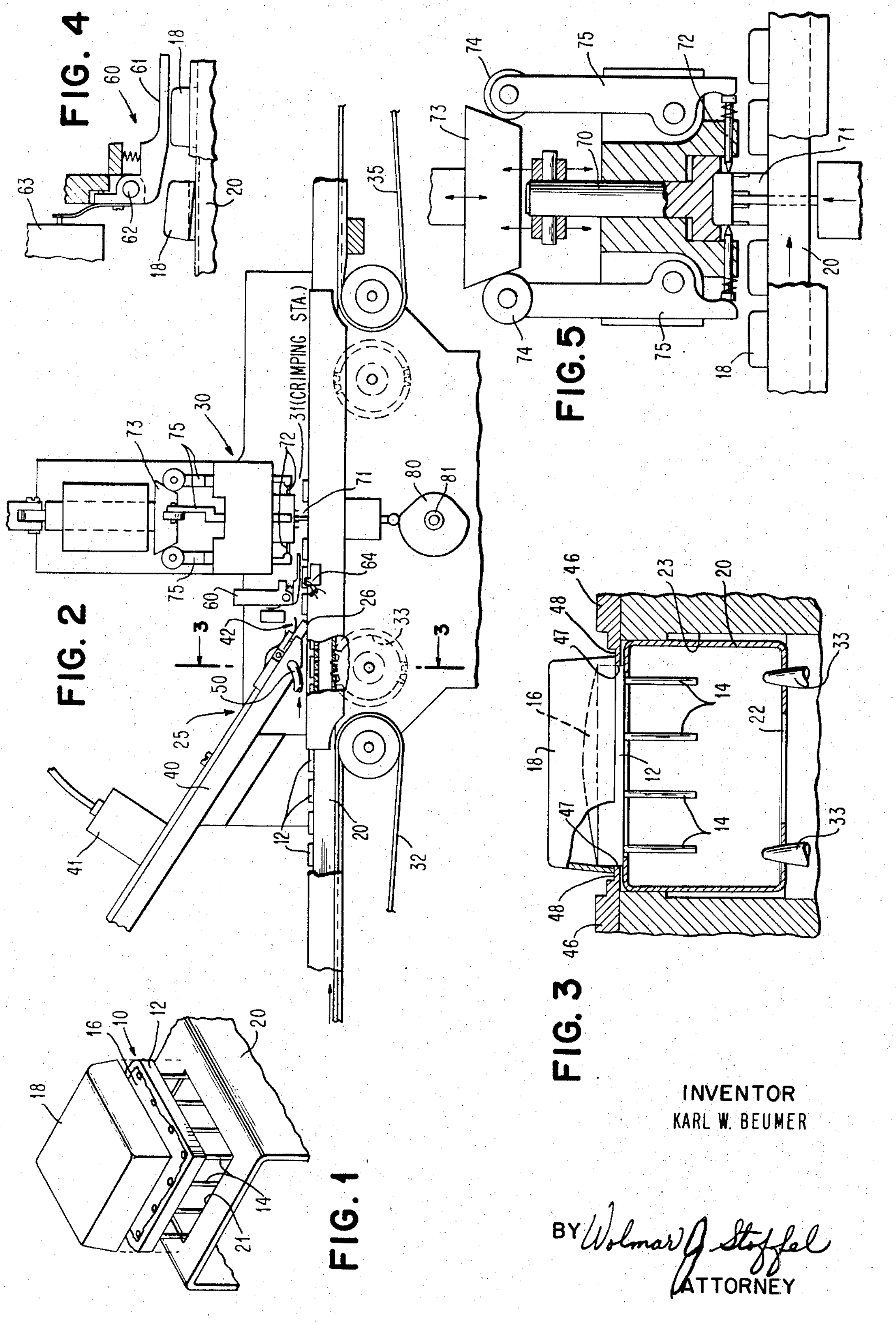
FIG. 1 is a detailed view in exploded relation of a typical module in combination with a carrier.
FIG. 2 is a front elevational view of a preferred specific embodiment of the capping apparatus of the invention shown in combination with a crimping apparatus.
FIG. 3 is a detail view in enlarged scale taken on line 3—3 of FIG. 2.
FIG. 4 is a detail front elevational view in enlarged scale of a preferred specific embodiment of the malfunctioning device embodied in the capping apparatus of the invention.
FIG. 5 is a detail front elevational view in enlarged scale in broken section of a preferred embodiment of a crimping apparatus used in combination with the capping apparatus of the invention.

Referring now to the figures of the drawings, and FIG. 1 in particular, there is illustrated the structure of a typical electronic module 10. Module 10 consists of a substrate 12 provided with a plurality of terminal pins 14, a conformal soft encapsulating coating 16, and a cover 18. In the operation of the preferred specific embodiment of the capping apparatus of my invention, module 10 is supported on a carrier 20 having a module positioning aperture 21 adapted to receive terminal pins 14.

Referring now to FIG. 2 of the drawings, there is illustrated a preferred specific embodiment of the capping apparatus 25 of my invention in combination with a crimping apparatus 30. Capping apparatus 25 has a generally horizontal conveyor means for moving substrates or the like to a capping station 26 and subsequently to a crimping station 31. In operation, substrates 12 are loaded on carriers 20, which carriers are adapted to accept a plurality of substrates in spaced relation. The carriers 20 are slidably received in a track 23 where they are frictionally engaged by input belt 32 and moved into meshing engagement with the carrier advancement sprocket 33. As indicated in FIG. 3 the carriers 20 are each provided with gear racks on the bottom side which are engaged by sprocket 33 after moving off input belt 32. Sprocket 33 is driven with a Geneva mechanism which provides intermittent movement to accommodate crimping apparatus 30, the operation of which will become more apparent in the description that follows. After the carriers 20 have been moved past the crimping station 30, they are again frictionally engaged by output belt 35 and conveyed to other appropriate loading or work stations, not shown or described. It is to be understood that the carriers 20 can be moved through the capping station 25 with either a continuous movement or intermittent movement. In the specific embodiment illustrated in the drawings, the intermittent movement is provided to accommodate the crimping operation occurring at crimping station 31.

The capping apparatus 25 has an inclined cover, or cap, chute 40 which terminates directly over the conveyor means. In operation, covers are fed into the cover chute 40 by any suitable means, as for example, a vibratory bowl. The covers 18 slide down chute 40 under the influence of gravity. The covers are placed in the cover chute with the open side down in position to be placed over the substrates at a capping station 26. A cover supply detection device 41 can be provided to interrupt movement of the conveyor means in the event that the supply of covers 18 is interrupted. Device 41 consists of a photoelectric cell adapted to detect the presence or absence of covers on chute 40.

Figures 6, 7, 8, 9, 10:
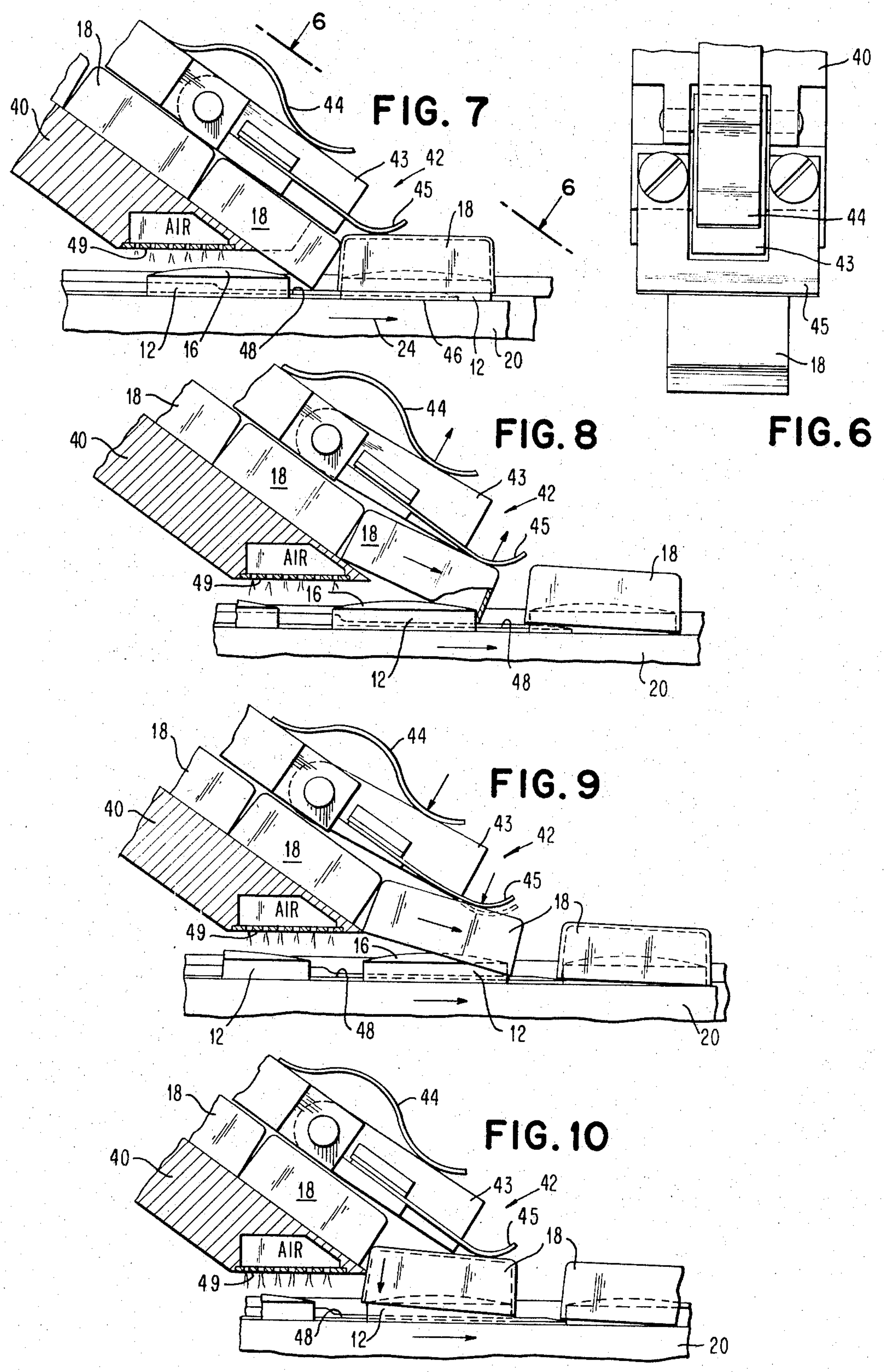
FIG. 6 is a detail view in enlarged scale of the pressure means taken on line 6—6 in FIG. 7.
FIGS. 7, 8, 9 and 10 are views in broken sections in enlarged scale which illustrate the relative positions of a substrate and a cover at various stages of a single capping operation.

A pressure means 42 is mounted on the end of cover chute 40. Pressure means 42 is illustrated in detail in FIGS. 6 through 10 and has a pivotally supported pressure pad 43 on the terminal end of chute 40 with a resilient leaf spring 44 for urging same downwardly. As indicated in FIG. 7 of the drawings, pressure pad 43 cannot be depressed downwardly at an angle greater than the angle of the cover chute with respect to the conveyor means. A resilient spring 45 having a generally U-shaped configuration, as indicated in FIG. 6, is mounted on the end of chute 40 and extends beyond the end of pressure pad 43. As most clearly indicated in FIG. 3, guide rails 46 are disposed in overlying relation to carrier 20. Guide rails 46 are provided with inwardly directed guide surfaces 47 adapted to accurately position substrates to be capped relative to the chute 40. Spaced, parallel, horizontal guide surfaces 48 contact and support the leading edges of covers 18 as they emanate from chute 40, as indicated in FIGS. 7 through 10.

On the lower terminal end of chute 40 there is provided a means for directing a downward current of air on substrates 12 as they move beneath the end of chute 40. The means for directing a downward current of air consists of a perforated plate 49 connected to a supply of compressed air through conduit 50. The downwardly directed current of air flowing through perforated plate 49 provides a gentle downwardly directed force on substrates 12 without physically contacting same to maintain them into position just prior to contact with the covers. The current of air prevents the modules from being displaced, particularly when the carrier is accelerated by the intermittent motion required for the crimping apparatus 30.

The downward current of air does not significantly disturb the tacky conformal coating of encapsulating material 16 provided on the top surface of substrate 12.

FIGS. 7 through 10 illustrate a detailed sequence of positions of cover and substrate during a single capping operation. As illustrated in FIG. 7 terminal cover 18 slides down chute 40 under the influence of gravity into abutting relation with surface 48 of guide rail 46. Pressure pad 43, urged downwardly by spring 44, allows cover 18 to assume the aforementioned abutting relation as the previously loaded cover is moved from the loading station 26. As carrier 20 is moved forwardly in the direction of arrow 24, the forward leading edge of the module comes into contact with the inside leading edge of the cover and the cover is drawn outwardly from the terminal end of chute 40 as indicated in FIG. 8. Pressure pad 43 and spring 45 exert a downward force on cover 18 assuring contact with the forward leading edge of the cover and the surface 48 of guide rail 46. Surface 48 of guide rail 46 maintains the leading edge of the cover 18 above the surface of the carrier 20 as most clearly indicated in FIG. 3. The height of surface 48 relative to the top surface of substrate 12 is just sufficient to raise the leading edge of the cover so that the cover can be snapped over the rear top edge of substrate 12. The diagonal distance between the point of contact of the leading edge of cover 18 on substrate 12 and the trailing upper edge of substrate 12 can be only slightly less than the inside distance between the front and rear wall of cover 18. As indicated in FIG. 10 spring 45 and pressure pad 43 cooperate to effect a snapping action of cover 18 over substrate 12. As shown in FIG. 10, the point of contact between spring 45 and the top of cover 18 as the cover is being flipped into position is located adjacent and rearwardly of a vertical plane drawn through the pivotal axis of the cover as it is being positioned. The point or area of contact between the cover 18 and spring 45 is important to proper operation. The downward component of the force exerted by spring 45 must maintain sufficient friction on the lower contacting edge of the cover 18 so that the cover will not move forwardly away from the leading edge of substrate 12, and also must provide a proper moment or torque for snapping the cover into position. The point of contact between spring 45 and the cover 18, and the relatively small mass of the spring 45, requiring a minimum of force to overcome the inertia thereof, provides an effective snapping action which allows the covers to be placed over the substrates at a very high rate.

A malfunction means 60 is provided to detect unseated or missing covers. The malfunction means 60 is illustrated in detail in FIG. 4 of the drawings. There is provided an arm 61 which is pivotally supported on pin 62. Arm 61 is arranged over the carriers 20 moved on the conveyor means at a height that will allow seated covers to pass underneath without contacting same. An unseated cover, as shown in FIG. 4, will force the horizontal extending portion of arm 61 upwardly to thereby actuate switch 63 and halt operation of the conveyor. In order to detect a missing cover there is provided a photoelectric cell 64 on one side of the conveyor means and a light source on the opposite side. The light source and photoelectric cell are positioned so that a cover properly seated on a substrate will block the light therebetween. A missing cover will allow light from the light source to actuate the photoelectric cell. The photoelectric cell when actuated will thereby interrupt operation of the conveyor means. The switch means actuated by the photoelectric cell can be actuated only at selected times when a module is positioned between the light source and the cell.

The modules after leaving the capping apparatus 25 are conveyed to the crimping apparatus 30. At the crimping station 31 the locator punch 70 is cammed downwardly over a module in position at the crimping station. Lower punch 71 is then cammed upwardly through opening 22 in carrier 20 by cam 80 mounted on shaft 81, to abut the underside of the module. Upper punch and lower punch 70 and 71, respectively, are then cammed upwardly to move the module into position between the crimping punches 72. Crimper cam 73 is then moved downwardly into engagement with cam followers 74 moving crimping levers 75 outwardly and forcing crimping punches 72 inwardly to crimp the portions of the cover into engagement with the substrate 12. There after, the crimping cam 73 is moved upwardly and the module lowered into position on the carrier by upper and lower punches 70 and 71. The conveyor is then advanced to place the next module supported on carrier 20 into position at the crimping station.

As will be appreciated, substrates can be capped at very high rates. However, the apparatus of the invention can be used in other applications other than capping of modules. The capping apparatus of the invention is particularly adapted to position covers or like elements over any suitable substrates where the clearance between the substrate and cover is very small and/or the top of the cover must not be disturbed. The term "substrate" can be construed broadly and encompasses any suitable element to be assembled with a cover, including filled portions of medical capsules, container elements and the like.

While the invention has been particularly shown and described with reference to a preferred embodiment thereof, it will be understood by those skilled in the art that the foregoing and other changes in form and details may be made therein without departing from the spirit and scope of the invention.

I claim:

1. An apparatus for positioning non-circular covers on substrates comprising, a generally horizontal conveyor means for substrates, an inclined cover chute for receiving successive covers from a supply thereof terminating over said conveyor means, a pressure means mounted on the end of said cover chute, disposed to exert a downward force on covers emanating from said cover chute, guide means adjacent said conveyor means, said guide means having at least one upwardly facing support surface positioned to initially abut and subsequently slidably support the leading edge portions of covers emanating from said cover chute, said pressure means adapted to apply a downward force to effect a pivotal snapping operation of a cover over the substrate as the cover is drawn from the chute and also apply sufficient force to assure abutting contact between the leading lower edge of the cover and the forward surface of the substrate being capped, the area of contact between said pressure means and a cover being positioned adjacent and rearwardly of a vertical plane drawn through the pivotal axis of a cover being positioned.

2. The appartus of claim 1 wherein said pressure means on said chute comprises, an extending pivotally supported pressure pad on the terminal end of said chute disposed over said conveyor means, a spring on the end of said chute having a cover contact surface portion extending beyond the end of said pressure pad, said pressure pad in operation adapted to maintain an initial momentary abutting relation between the leading lower edge of a cover being positioned and said guide means.

3. The appartus of claim 1 wherein there is provided a means on the terminal end of said cover chute for directing a downward current of air on substrates on said conveyor means, said means for directing a downward current of air adapted to stabilize the relative position of a substrate to be capped and said conveyor means preparatory to moving under the terminal end of said chute.

4. The apparatus of claim 1 wherein said conveyor means comprises a plurality of elongated trays, each tray having apertures to engage substrates positioned thereon, and means to sequentially advance said trays beneath said cover chute to thereby position covers on the substrates.

5. The apparatus of claim 4 wherein said guide means comprises parallel guide rails having inwardly directed portions overlying said trays, said guide rails having inwardly directed first guide surfaces adapted to accurately position substrates relative to said cover chute, and second spaced parallel horizontal guide surfaces adapted to contact the leading edges of covers emanating from said chute.

6. The apparatus of claim 1 wherein said guide means comprises parallel guide rails having an inwardly directed first guide surface adapted to accurately slidably position substrates on said conveyor means, and second spaced parallel horizontal guide surfaces adapted to contact the leading edges of covers emanating from said chute.

7. The apparatus of claim 1 wherein there is provided a malfunction means to interrupt operation, said malfunction means comprising, movable cover contact means disposed downwardly from said chute and above said conveyor means in spaced relation thereto adapted to be actuated by a cover unseated from a substrate, first switch means actuated by said contact means adapted to interrupt movement of said conveyor means.

8. The apparatus of claim 7 wherein said malfunction means includes a cover presence sensor means, said cover presence sensor means comprising, a light source mounted on one side of said conveyor means, a photoelectric cell mounted on the opposite side of said conveyor means, said light source and photoelectric cell positioned such that a cover properly sealed on a substrate will block light therebetween, a second switch means actuated by said photoelectric cell to interrupt operation of said conveyor means.

References Cited

UNITED STATES PATENTS

| | | | |
|---|---|---|---|
| 2,481,508 | 9/1949 | Gschwend et al. | 53—315 |
| 2,839,882 | 6/1958 | De Bastos et al. | 53—315 |
| 3,216,096 | 11/1965 | Rayburn | 29—203 |
| 3,302,278 | 2/1967 | Whitney | 29—208 X |

THOMAS H. EAGER, *Primary Examiner.*